(12) United States Patent
Tsuyutani et al.

(10) Patent No.: US 10,515,898 B2
(45) Date of Patent: Dec. 24, 2019

(54) CIRCUIT BOARD INCORPORATING SEMICONDUCTOR IC AND MANUFACTURING METHOD THEREOF

(71) Applicant: TDK CORPORATION, Tokyo (JP)

(72) Inventors: Kazutoshi Tsuyutani, Tokyo (JP); Masashi Katsumata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/978,443

(22) Filed: May 14, 2018

(65) Prior Publication Data

US 2018/0337131 A1 Nov. 22, 2018

(51) Int. Cl.
*H01L 23/538* (2006.01)
*H01L 23/00* (2006.01)

(52) U.S. Cl.
CPC .......... *H01L 23/5384* (2013.01); *H01L 24/03* (2013.01); *H01L 24/06* (2013.01); *H01L 24/19* (2013.01); *H01L 24/24* (2013.01); *H01L 24/82* (2013.01); *H01L 24/96* (2013.01); *H01L 2224/04105* (2013.01); *H01L 2224/24137* (2013.01); *H01L 2224/24226* (2013.01); *H01L 2224/32225* (2013.01); *H01L 2224/73267* (2013.01); *H01L 2224/82005* (2013.01); *H01L 2224/9222* (2013.01); *H01L 2224/96* (2013.01)

(58) Field of Classification Search
CPC ..... H01L 23/5384; H01L 24/03; H01L 24/06; H01L 2224/04105; H01L 2224/24137
See application file for complete search history.

(56) References Cited

U.S. PATENT DOCUMENTS

| 2009/0305076 | A1* | 12/2009 | Wong | H01L 21/6835 428/607 |
| 2013/0337609 | A1* | 12/2013 | Nondhasitthichai | H01L 21/568 438/113 |
| 2014/0015131 | A1* | 1/2014 | Meyer | H01L 23/49816 257/738 |
| 2015/0115475 | A1* | 4/2015 | Palm | H01L 24/19 257/777 |
| 2016/0307834 | A1* | 10/2016 | Suzuki | H01L 23/49827 |
| 2017/0345761 | A1* | 11/2017 | Yu | H01L 21/6835 |

FOREIGN PATENT DOCUMENTS

JP  2007-165810 A  6/2007

* cited by examiner

*Primary Examiner* — Sitaramarao S Yechuri
(74) *Attorney, Agent, or Firm* — Young Law Firm, P.C.

(57) ABSTRACT

Disclosed herein is a circuit board that includes a first insulating layer having an upper surface; a first wiring layer embedded in the first insulating layer, the first wiring layer having an upper surface exposed from the upper surface of the first insulating layer such that the upper surface of the first wiring layer is substantially coplanar with the upper surface of the first insulating layer; a semiconductor IC mounted on the upper surface of the first wiring layer with a die attach material interposed therebetween; and a second insulating layer stacked on the upper surface of the first wiring layer so as to embed the semiconductor IC, wherein a bottom surface of the die attach material is in contact with both of the upper surface of the first insulating layer and the upper surface of the first wiring layer.

16 Claims, 7 Drawing Sheets

CIRCUIT BOARD INCORPORATING SEMICONDUCTOR IC AND MANUFACTURING METHOD THEREOF

BACKGROUND OF THE INVENTION

Field of the Invention

The present invention relates to a circuit board incorporating semiconductor IC and a manufacturing method thereof, and particularly relates to a circuit board incorporating semiconductor IC provided with a die attach material on a bottom surface of a semiconductor IC and a manufacturing method of the circuit board incorporating semiconductor IC.

Description of Related Art

In recent years, there are significant demands for downsizing and functionality enhancement of mobile electronic devices such as smart phones and tablets, and in order to achieve the downsizing and functionality enhancement, a circuit board incorporating semiconductor IC embedded in a multi-layer substrate thereof is used in some cases. For example, a circuit board incorporating semiconductor IC described in Japanese Patent Application Laid-open No. 2007-165810 is produced by forming a recess in a predetermined insulating layer constituting a multi-layer substrate and embedding a semiconductor IC in this recess.

Figure 13:
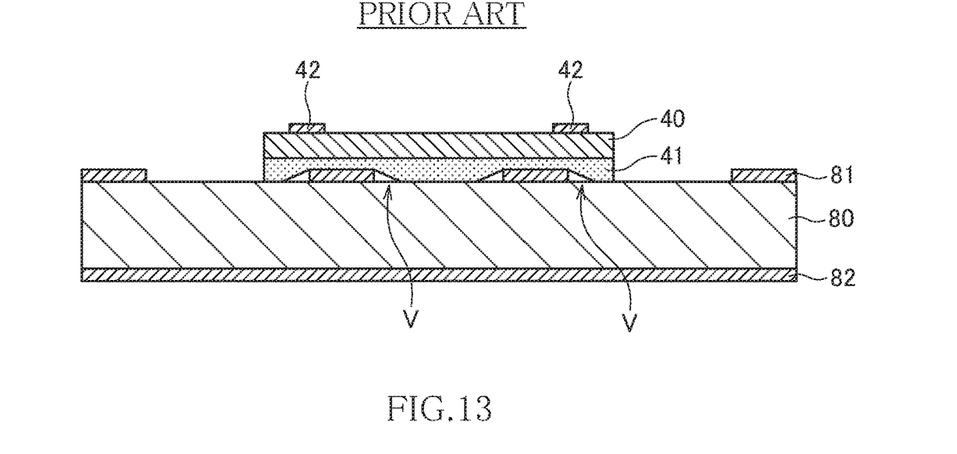
FIG. 13 to FIG. 14 are process diagrams for explaining a manufacturing method of a conventional circuit board incorporating semiconductor IC.
Figure 14:
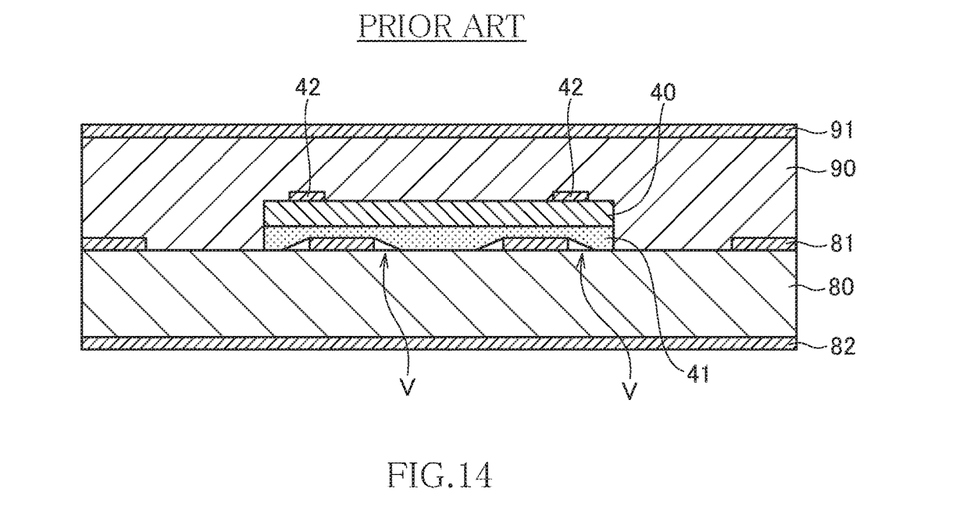

However, in the circuit board incorporating semiconductor IC described in Japanese Patent Application Laid-open No. 2007-165810, because wires cannot be arranged on a bottom surface of the semiconductor IC, there is a problem of low use efficiency of wiring layer. To solve this problem, there is conceived a method in which, as illustrated in FIG. 13, a semiconductor IC 40 is mounted on an insulating layer 80 having a wiring layer 81 formed on an upper surface thereof with a die attach film 41 interposed therebetween, and subsequently, as illustrated in FIG. 14, an insulating layer 90 is formed to embed the semiconductor IC 40. Thereafter, terminal electrodes 42 of the semiconductor IC 40 and a wiring layer 91 are connected via through hole conductors and wiring layers 82 and 91 are patterned to form wiring patterns, thereby completing a circuit board incorporating semiconductor IC.

However, in the method described above, a void V (space) is generated between the insulating layer 80 and the die attach film 41 in the vicinity of the wiring layer 81, and thus there is a risk of reduced reliability of an end product. This void is generated because a level difference is made on the surface of the insulating layer 80 by the wiring layer 81, and it is difficult to completely embed this level difference with the die attach film 41.

SUMMARY

It is therefore an object of the present invention to provide a circuit board incorporating semiconductor IC in which wires can be arranged on a bottom surface of the semiconductor IC and no void is generated between a die attach material and an insulating layer, and to provide a manufacturing method of the circuit board incorporating semiconductor IC.

A circuit board incorporating semiconductor IC according to the present invention includes a first insulating layer having an upper surface; a first wiring layer embedded in the first insulating layer, the first wiring layer having an upper surface exposed from the upper surface of the first insulating layer such that the upper surface of the first wiring layer is coplanar with the upper surface of the first insulating layer; a semiconductor IC mounted on the upper surface of the first wiring layer with a die attach material interposed therebetween; and a second insulating layer stacked on the upper surface of the first wiring layer so as to embed the semiconductor IC, wherein a bottom surface of the die attach material is in contact with both of the upper surface of the first insulating layer and the upper surface of the first wiring layer.

According to the present invention, because the first wiring layer is embedded in the first insulating layer and the upper surfaces of the both layers are flush with each other, no void is generated between the die attach material and the first insulating layer. Further, because the first wiring layer positioned on a bottom surface of the semiconductor IC can be utilized, use efficiency of the wiring layer can be increased.

In the present invention, it is permissible that the bottom surface of the die attach material is in contact with a plurality of signal wires constituting the first wiring layer. This configuration further increases use efficiency of the wiring layer.

It is permissible that the circuit board incorporating semiconductor IC according to the present invention further includes a second wiring layer formed on an upper surface of the second insulating layer, a first through-hole conductor penetrating the second insulating layer to electrically connect the first wiring layer to the second wiring layer, and a second through-hole conductor penetrating the second insulating layer to electrically connect the second wiring layer to a terminal electrode of the semiconductor IC. In this case, it is permissible that the circuit board incorporating semiconductor IC according to the present invention further includes a third wiring layer formed on a lower surface of the first insulating layer, and a third through-hole conductor penetrating the first insulating layer to electrically connect the first wiring layer to the third wiring layer, and the circuit board incorporating semiconductor IC further includes a third insulating layer stacked on the upper surface of the second insulating layer so as to embed the second wiring layer, a fourth wiring layer formed on an upper surface of the third insulating layer, and a fourth through-hole conductor penetrating the third insulating layer to electrically connect the second wiring layer to the fourth wiring layer. With these configurations, a circuit board incorporating semiconductor IC having a larger number of wiring layers can be provided.

In the present invention, it is permissible that the die attach material is a die attach film bonded on a bottom surface of the semiconductor IC. With this configuration, even when the thickness of the semiconductor IC is very thin, the semiconductor IC can be handled well. In this case, the die attach film can be thicker than a silicon part constituting the semiconductor IC. With this configuration, a thinner semiconductor IC can be used.

A manufacturing method of a circuit board incorporating semiconductor IC according to the present invention includes a first step for preparing a stacked body of a base and a conductor foil and mounting a semiconductor IC on the conductor foil with a die attach material interposed therebetween, a second step for forming a second insulating layer on the conductor foil so as to embed the semiconductor IC, a third step for removing the base, a fourth step for patterning the conductor foil to form a first wiring layer, and a fifth step for forming a first insulating layer on a lower surface of the second insulating layer so as to embed the first wiring layer, wherein in the fourth step, the conductor foil is patterned so that a portion of a bottom surface of the die attach material is covered with the first wiring layer and a remaining portion of the bottom surface of the die attach material is exposed, thereby the remaining portion of the bottom surface of the die attach material is in contact with the first insulating layer.

According to the present invention, there is no level difference on a bed when a semiconductor IC is mounted thereon, because the first wiring layer is formed by patterning a conductor foil after the semiconductor IC is mounted on the conductor foil. Therefore, generation of a void due to a level difference can be prevented.

In the present invention, it is permissible that the conductor foil is constituted of a first conductor foil and a second conductor foil that are stacked in this order on a surface of the base, and in the third step, the first conductor foil and the second conductor foil can be peeled off at an interface therebetween, thereby using the second conductor foil as a material for the first wiring layer. With this process, the base can be removed easily. In this case, it is permissible that the second conductor foil is thicker than the first conductor foil. Even when the thickness of the second conductor foil that eventually becomes the first wiring layer is large, there is no level difference when a semiconductor IC is mounted, and thus no void is generated.

It is permissible that the manufacturing method of a circuit board incorporating semiconductor IC according to the present invention further includes a step of forming, after the second step is performed, a first through hole that penetrates the second insulating layer to expose the conductor foil and a second through hole that penetrates the second insulating layer to expose a terminal electrode of the semiconductor IC. With this step, a circuit board incorporating semiconductor IC having a multi-layer wiring structure can be produced.

As described above, according to the present invention, it is possible to provide a circuit board incorporating semiconductor IC in which wires can be arranged on a bottom surface of a semiconductor IC and no void is generated between a die attach material and an insulating layer, and to provide a manufacturing method of the circuit board incorporating semiconductor IC.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
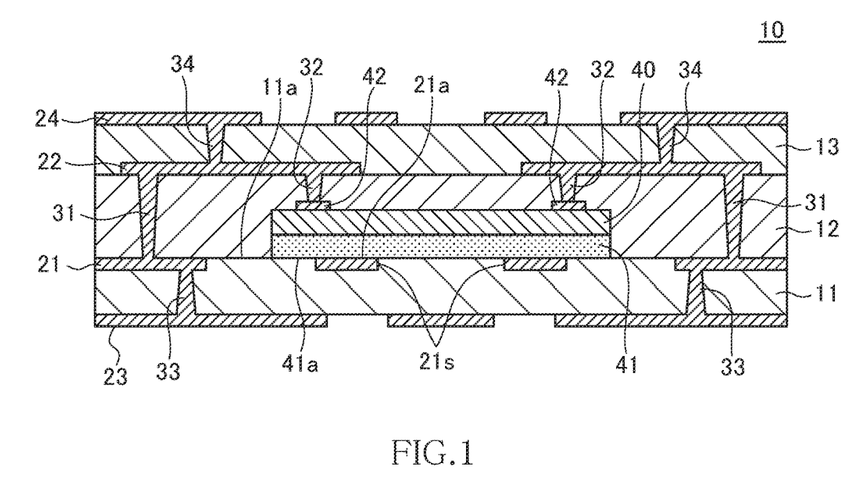
FIG. 1 is a cross-sectional view for explaining a structure of a circuit board incorporating semiconductor IC according to a preferred embodiment of the present invention.

FIG. 1 is a cross-sectional view for explaining a structure of a circuit board 10 incorporating semiconductor IC according to a preferred embodiment of the present invention.

As illustrated in FIG. 1, circuit board 10 according to the present embodiment includes first to third insulating layers 11 to 13, first to fourth wiring layers 21 to 24, and a semiconductor IC 40 embedded inside of the circuit board 10. The first to third insulating layers 11 to 13 are formed of an insulating material such as resin, in which the thickness of at least the second insulating layer 12 is set larger than that of the semiconductor IC 40.

A wiring pattern made of a good conductor such as copper (Cu) is formed in each of the first to fourth wiring layers 21 to 24. Among these wiring layers, the first wiring layer 21 is positioned between the first insulating layer 11 and the second insulating layer 12, and the second wiring layer 22 is positioned between the second insulating layer 12 and the third insulating layer 13. The third wiring layer 23 is positioned on a lower surface of the first insulating layer 11, and the fourth wiring layer 24 is positioned on an upper surface of the third insulating layer 13.

Further, in the circuit board 10 according to the present embodiment, a plurality of through-hole conductors 31 to 34 are provided while penetrating the first to third insulating layers 11 to 13. Among these through-hole conductors, the first through-hole conductors 31 penetrate the second insulating layer 12 to electrically connect the first wiring layer 21 and the second wiring layer 22. The second through-hole conductors 32 penetrate the second insulating layer 12 to electrically connect the second wiring layer 22 and terminal electrodes 42 of the semiconductor IC 40. The third through-hole conductors 33 penetrate the first insulating layer 11 to electrically connect the first wiring layer 21 and the third wiring layer 23. The fourth through-hole conductors 34 penetrate the third insulating layer 13 to electrically connect the second wiring layer 22 and the fourth wiring layer 24.

As illustrated in FIG. 1, in the circuit board 10 according to the present embodiment, the first wiring layer 21 is embedded in the first insulating layer 11, and an upper surface 21a of the first wiring layer 21 and the upper surface 11a of the first insulating layer 11 are coplanar with each other. The upper surface 21a of the first wiring layer 21 is exposed from the upper surface 11a of the first insulating layer 11. A die attach film 41 is bonded on a bottom surface of the semiconductor IC 40, and the semiconductor IC 40 is arranged on the upper surface 21a of the first wiring layer 21 with the die attach film 41 interposed therebetween.

The reason for bonding the die attach film 41 on the bottom surface of the semiconductor IC 40 is not only to secure adhesive force to the upper surface 21a of the first wiring layer 21, but to increase the handleability of the semiconductor IC 40. The semiconductor IC 40 used in the present embodiment is made thin by grinding the bottom surface. However, when its thickness is reduced to approximately 50 μm, for example, the handling thereof during implementation becomes difficult, and damage to a chip can occur. To solve such a problem, in the present embodiment, the die attach film 41 is attached on the bottom surface of the semiconductor IC 40, thereby securing the handleability during implementation. Each of the thicknesses of the semiconductor IC 40 and the die attach film 41 can be approximately 25 μm, but are not particularly limited thereto. When the thickness of the semiconductor IC 40 is thinner or when the handleability of the semiconductor IC 40 needs to be increased, the thickness of the die attach film 41 can be set larger than that of a silicon part constituting the semiconductor IC 40.

In the present embodiment, a bottom surface 41a of the die attach film 41 is not only in contact with the upper surface 21a of the first wiring layer 21 but also in contact with the upper surface 11a of the first insulating layer 11. Despite that the bottom surface 41a of the die attach film 41 is in contact with the first wiring layer 21 in this way, the upper surface 11a of the first insulating layer 11 and the upper surface 21a of the first wiring layer 21 are coplanar with each other in the present embodiment. Therefore, similarly to the conventional examples illustrated in FIG. 13 and FIG. 14, no void or the like is generated in the bottom surface 41a of the die attach film 41. In the example illustrated in FIG. 1, two signal wires 21s in contact with the die attach film 41 are illustrated, but in practice, a larger number of signal wires and power wires can be laid out so as to be in contact with the bottom surface 41a of the die attach film 41.

As described above, in the circuit board 10 incorporating semiconductor IC according to the present embodiment, because the upper surface 11a of the first insulating layer 11 and the upper surface 21a of the first wiring layer 21 are coplanar with each other, no void or the like is generated even when the semiconductor IC 40 is mounted on the surface with the die attach film 41 interposed therebetween. Therefore, the reliability of an end product can be increased while achieving thickness reduction of the whole substrate. Further, a plurality of signal wires can be laid out in a region that is in contact with the bottom surface 41a of the die attach film 41, and thus use efficiency of the first wiring layer 21 can also be increased.

Next, a manufacturing process of the circuit board 10 incorporating semiconductor IC according to the present embodiment is described.

FIG. 2 to FIG. 12 are process diagrams for explaining a manufacturing method of the circuit board incorporating semiconductor IC 10 according to the present embodiment.

Figure 2:
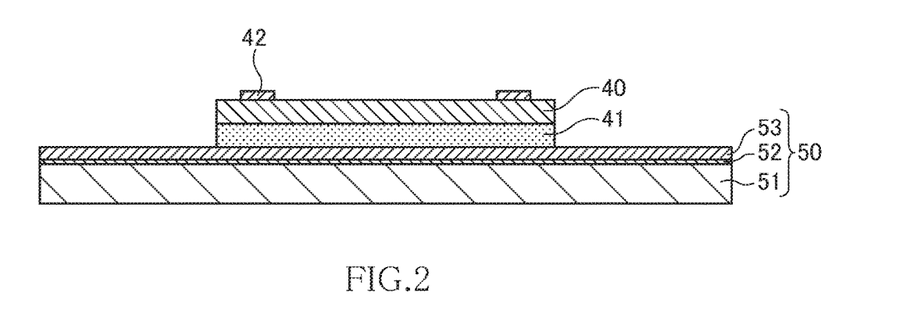
FIG. 2 to FIG. 12 are process diagrams for explaining a manufacturing method of the circuit board incorporating semiconductor IC according to a preferred embodiment of the present invention.

First, as illustrated in FIG. 2, there is prepared a stacked body 50 in which a first conductor foil 52 and a second conductor foil 53 are stacked in this order on a surface of a base 51. The base 51 is made of cured resin or the like, and the first and second conductor foils 52 and 53 are made of a good conductor such as copper (Cu). A peeling layer (not illustrated) is interposed between the first conductor foil 52 and the second conductor foil 53, and the stacked body 50 is configured such that the both foils can be easily peeled off each other at this interface. On the other hand, the base 51 and the first conductor foil 52 are bonded relatively strongly by the anchor effect at an interface therebetween.

On the second conductor foil 53 of the stacked body 50 having such a configuration, the semiconductor IC 40 is mounted by a face-up manner with the die attach film 41 interposed therebetween. The face-up manner refers to a method of mounting a semiconductor chip so that terminal electrodes 42 provided on the semiconductor IC 40 are on an upside. At this time, because the second conductor foil 53 is flat, no gap or the like is generated between the die attach film 41 and the second conductor foil 53. It is permissible that alignment marks indicating a mounting position of the semiconductor IC 40 is formed on the first and second conductor foils 52 and 53 in advance.

Before the semiconductor IC 40 is mounted, it is preferable that the surface of the second conductor foil 53 is roughened by etching or blasting. With this process, by the anchor effect, adhesion between the second conductor foil 53 and the die attach film 41 is increased, and also adhesion between the second conductor foil 53 and the second insulating layer 12 described below is increased.

Figure 3:
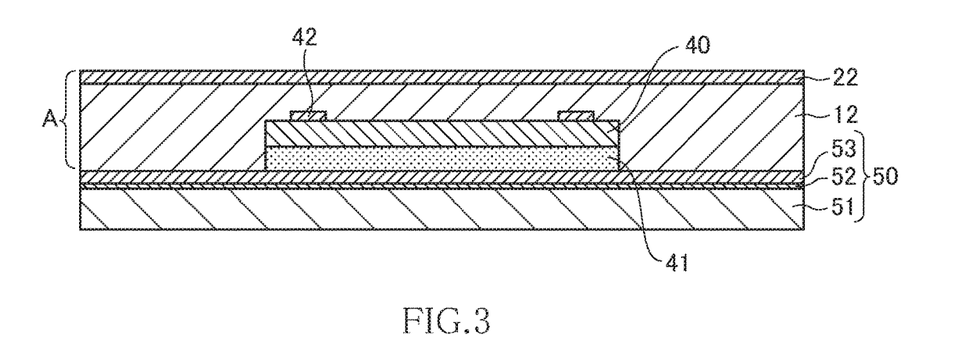

Next, as illustrated in FIG. 3, the second insulating layer 12 is formed on the stacked body 50 so as to embed the semiconductor IC 40. Specifically, there is prepared a stacked body A in which a conductor foil is attached to one surface of an uncured or half-cured resin film, the stacked body A is placed on the stacked body 50 so that the uncured or half-cured resin film is in contact with the second conductor foil 53 of the stacked body 50, and the uncured or half-cured resin film is cured by hot pressing. With this process, the cured resin film becomes the second insulating layer 12, and the conductor foil attached on an upper surface thereof becomes the second wiring layer 22. Because the resin film is subjected to vacuum hot pressing in an uncured or half-cured state, unevenness due to the semiconductor IC 40 does not occur, and no void or the like is formed around the semiconductor IC 40.

Figure 4:
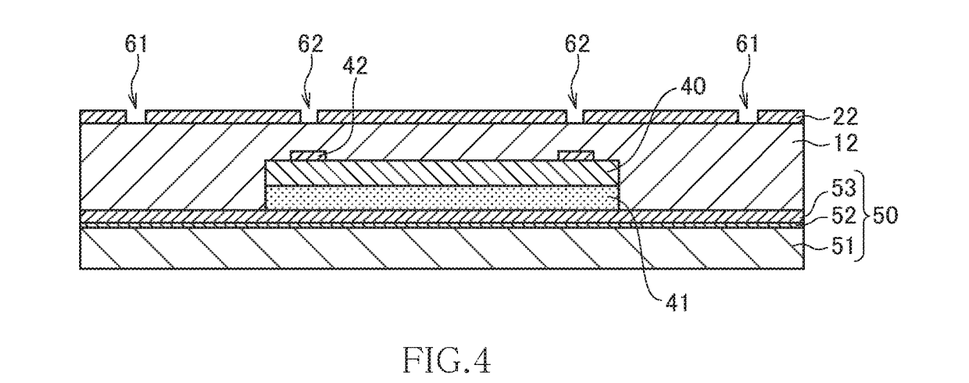

Next, as illustrated in FIG. 4, first and second openings 61 and 62 are formed at predetermined positions by removing portions of the second wiring layer 22. In this case, the second openings 62 are provided at positions overlapping with the terminal electrodes 42 of the semiconductor IC 40 as viewed in a stacking direction. The first and second openings 61 and 62 can be formed by forming a mask by photolithography method, and thereafter etching the second wiring layer 22 via the mask.

Figure 5:
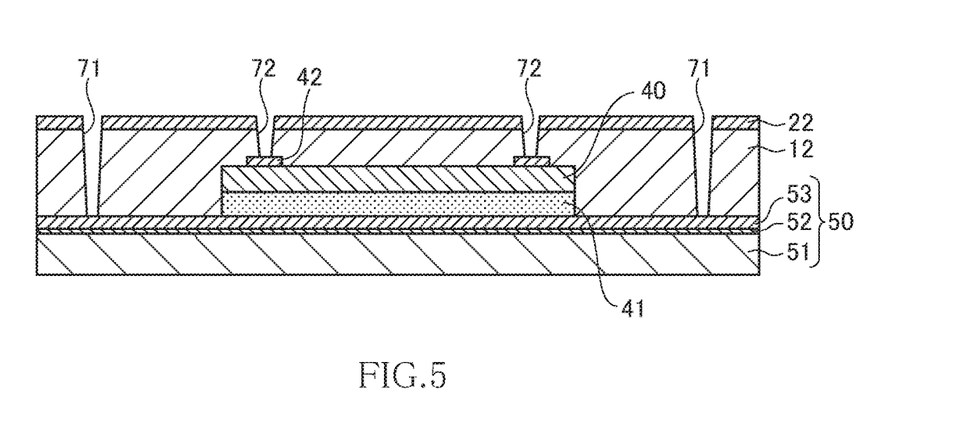

Next, as illustrated in FIG. 5, first and second through holes 71 and 72 are formed in the second insulating layer 12 with the second wiring layer 22, in which the first and second openings 61 and 62 are formed, as a mask. The first through holes 71 penetrate the second insulating layer 12 to reach the second conductor foil 53 of the stacked body 50, and the second conductor foil 53 is exposed in bottom portions of the through holes 71. The second through holes 72 penetrate the second insulating layer 12 to reach the terminal electrodes 42 of the semiconductor IC 40, and the terminal electrodes 42 are exposed in bottom portions of the through holes 72. The first and second through holes 71 and 72 can be formed by using laser machining, blasting, and the like.

Figure 6:
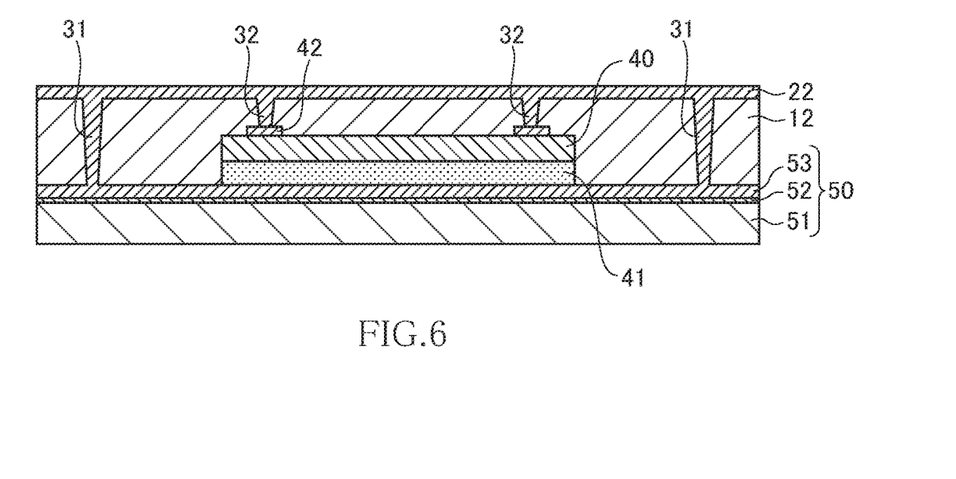

Next, as illustrated in FIG. 6, the first and second through-hole conductors 31 and 32 are formed in the first and second through holes 71 and 72 by performing electrolytic plating or the like. With this formation, the second wiring layer 22 and the second conductor foil 53 of the stacked body 50 are connected via the first through-hole conductors 31, and the second wiring layer 22 and the terminal electrodes 42 of the semiconductor IC 40 are connected via the second through-hole conductors 32.

Figure 7:
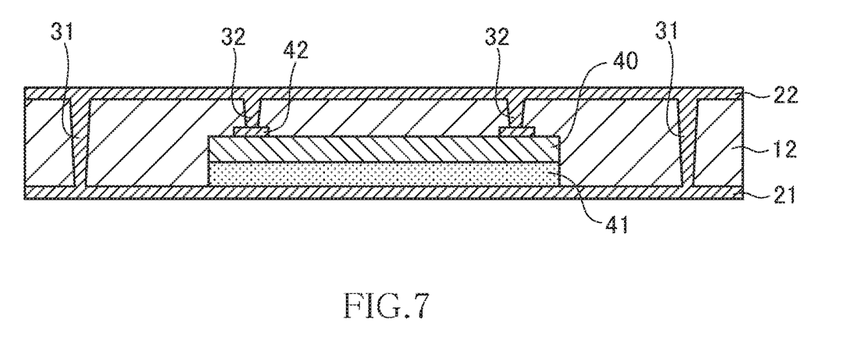

Next, as illustrated in FIG. 7, the first conductor foil 52 and the second conductor foil 53 of the stacked body 50 are peeled off each other at the interface therebetween, thereby removing the base 51 and the first conductor foil 52. As described above, the first conductor foil 52 and the second conductor foil 53 can be easily peeled off because a peeling layer is provided at the interface therebetween. Therefore, the remaining second conductor foil 53 becomes the first wiring layer 21.

Figure 8:
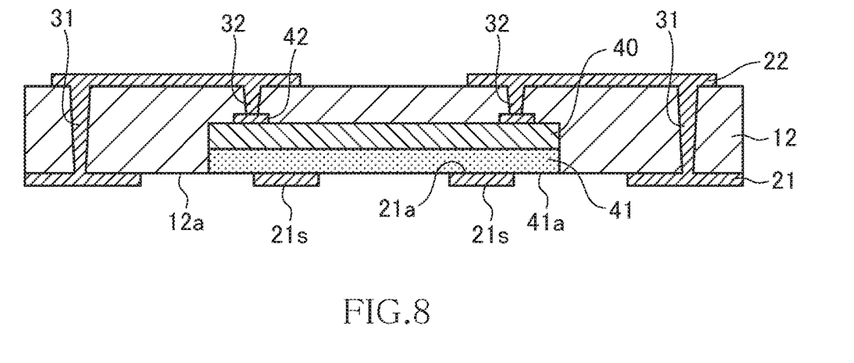

Next, as illustrated in FIG. 8, predetermined wiring patterns are formed by patterning the first and second wiring layers 21 and 22. Patterning of the first wiring layer 21 is performed so that portions of the bottom surface 41a of the die attach film 41 are covered with the first wiring layer 21, and remaining portions of the bottom surface 41a of the die attach film 41 are exposed. The example illustrated in FIG. 8 represents a state in which two signal wires 21s in contact with the bottom surface 41a of the die attach film 41 are formed by patterning the first wiring layer 21. As described above, because the die attach film 41 is provided so as to be in contact with a surface of a flat second conductor foil 53, there is no gap between these elements, and upper surfaces 21a of the signal wires 21s and the bottom surface 41a of the die attach film 41 are flush with each other. The bottom surface 41a of the die attach film 41 and a lower surface 12a of the second insulating layer 12 are also flush with each other.

Figure 9:
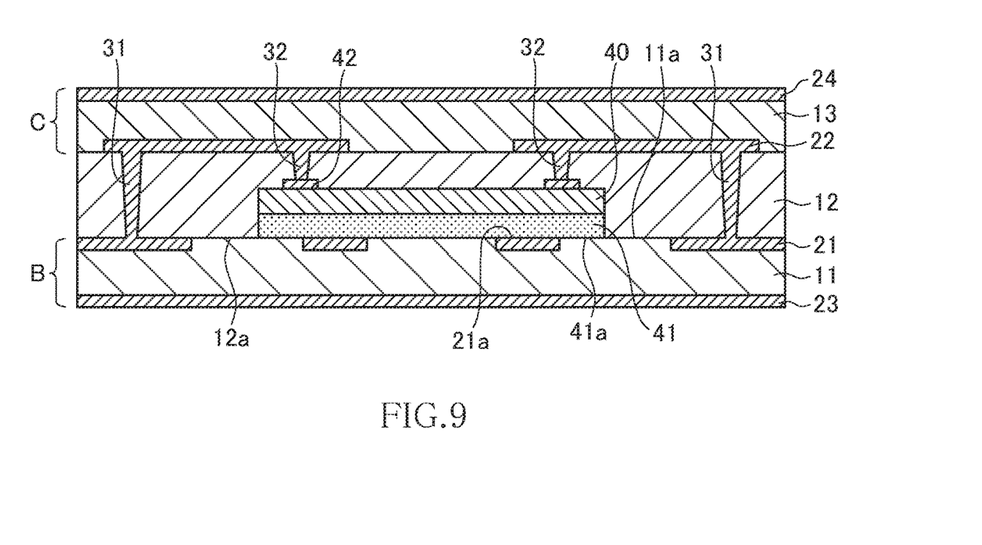

Next, as illustrated in FIG. 9, the first insulating layer 11 that covers the first wiring layer 21 and the third insulating layer 13 that covers the second wiring layer 22 are formed. Specifically, stacked bodies B and C in which a conductor foil is attached to one surface of an uncured or half-cured resin film are prepared, and the second insulating layer 12 is sandwiched with the two stacked bodies B and C so that the uncured or half-cured resin films face the second insulating layer 12. In this state, vacuum hot pressing is performed to cure the uncured or half-cured resin films. With this process, the cured resin films become the first and third insulating layers 11 and 13, and the conductor foils attached to an upper surface and a lower surface of the insulating layers 11 and 13 become the third and fourth wiring layers 23 and 24.

In this manner, portions of the bottom surface 41a of the die attach film 41 that are not covered with the first wiring layer 21 and are exposed are covered with the first insulating layer 11. The upper surface 11a of the first isulating layer 11, the lower surface 12a of the second insulating layer 12, the upper surface 21a of the first wiring layer 21, and the bottom surface 41a of the die attach film 41 are flush with each other. Because the resin films are subjected to vacuum hot pressing in an uncured or half-cured state, unevenness due to the first wiring layer 21 does not occur, and no void or the like is formed around the first wiring layer 21. Similarly, unevenness due to the second wiring layer 22 does not occur, and no void or the like is formed around the second wiring layer 22.

It is preferable that, before the first and third insulating layers 11 and 13 are formed, surfaces of the first and second wiring layers 21 and 22 are roughened by etching or blasting. With this process, adhesion between the first wiring layer 21 and the first insulating layer 11 is increased by the anchor effect, and adhesion between the second wiring layer 22 and the third insulating layer 13 is increased.

Figure 10:
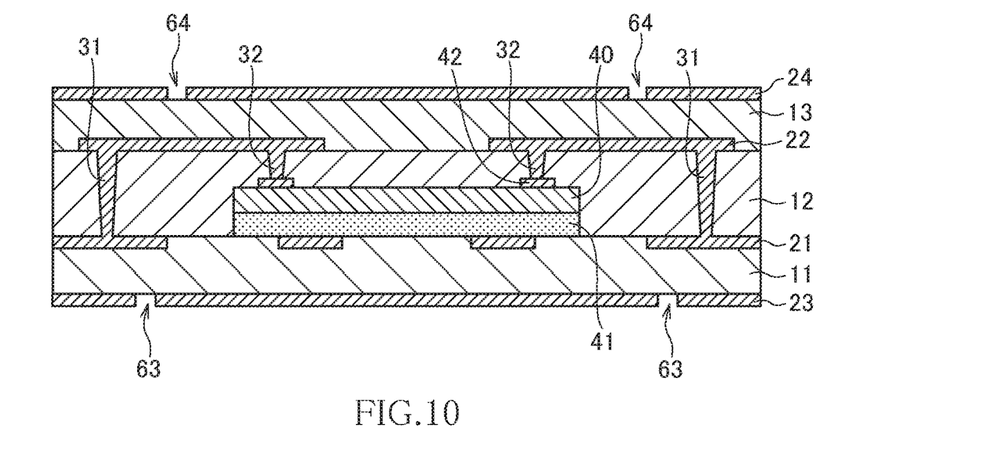

Next, as illustrated in FIG. 10, third openings 63 are formed at predetermined positions by removing portions of the third wiring layer 23, and fourth openings 64 are formed at predetermined positions by removing portions of the fourth wiring layer 24. The third openings 63 are provided at positions overlapping with the first wiring layer 21 as viewed in a stacking direction, and the fourth openings 64 are provided at positions overlapping with the second wiring layer 22 as viewed in the stacking direction. The third and fourth openings 63 and 64 can be formed by forming a mask by photolithography method, and thereafter etching the third and fourth wiring layers 23 and 24 via the mask.

Figure 11:
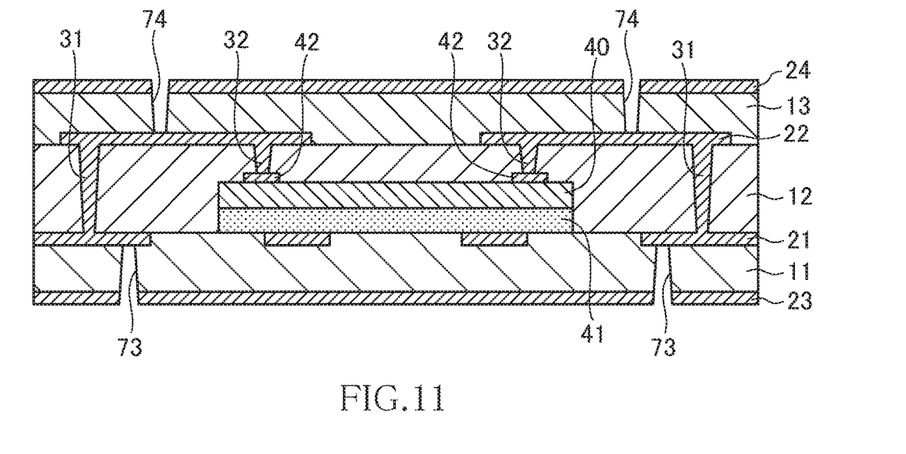

Next, as illustrated in FIG. 11, third through holes 73 are formed in the first insulating layer 11 and fourth through holes 74 are formed in the third insulating layer 13 with the third and fourth wiring layers 23 and 24, in which third and fourth openings 63 and 64 are formed, being masks. The third through holes 73 penetrate the first insulating layer 11 to reach the first wiring layer 21, and the first wiring layer 21 is exposed in bottom portions of the third through holes 73. The fourth through holes 74 penetrate the third insulating layer 13 to reach the second wiring layer 22, and the second wiring layer 22 is exposed in bottom portions of the fourth through holes 74. The third and fourth through holes 73 and 74 can be formed by using laser machining, blasting, and the like.

Figure 12:
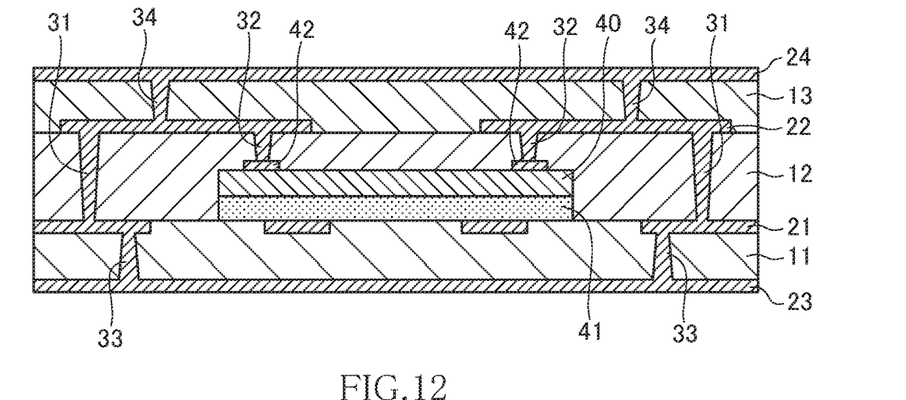

Next, as illustrated in FIG. 12, the third and fourth through-hole conductors 33 and 34 are formed in the third and fourth through holes 73 and 74 by performing electrolytic plating or the like. With this process, the first wiring layer 21 and the third wiring layer 23 are electrically connected via the third through-hole conductors 33, and the second wiring layer 22 and the fourth wiring layer 24 are electrically connected via the fourth through-hole conductors 34.

By patterning the third and fourth wiring layers 23 and 24 to form predetermined wiring patterns, the circuit board 10 incorporating semiconductor IC illustrated in FIG. 1 is completed.

As described above, in the manufacturing method of the circuit board 10 according to the present embodiment, the semiconductor IC 40 is mounted on a flat conductor foil 53 with the die attach film 41 interposed therebetween, and then the conductor foil 53 is patterned to form the first wiring layer 21 instead of mounting the semiconductor IC 40 on a patterned wiring layer 81 with the die attach film 41 interposed therebetween as in the conventional manufacturing methods illustrated in FIG. 13 and FIG. 14. Therefore, no void due to an uneven shape of the first wiring layer 21 is formed. As a result, decrease in reliability due to causes such as expansion of liquid that has entered a void can be prevented.

It is apparent that the present invention is not limited to the above embodiments, but may be modified and changed without departing from the scope and spirit of the invention.

In the embodiment described above, while a circuit board incorporating semiconductor IC having four wiring layers has been described by way of example, the present invention is not limited thereto.

Further, in the embodiment described above, an example of mounting the semiconductor IC 40 with the die attach film 41 interposed therebetween has been described; however, it is permissible that a different die attach material such as a die attach paste can be used instead of the die attach film 41. Note that, in view of improving the handleability of the semiconductor IC, it is particularly preferable that a die attach film is used as the die attach material.

Furthermore, in the embodiment described above, the stacked body 50 in which the first conductor foil 52 and the second conductor foil 53 are stacked on a surface of the base 51 is used; however, the configuration of the stacked body used in the present invention is not limited thereto. For example, it is also permissible that a stacked body formed of a base and a single conductor foil is used, or a stacked body formed of two conductor foils is used. In the processing illustrated in FIG. 9, it is permissible that, instead of the stacked bodies B and C, uncured or half-cured resin and a copper foil is used and then they are simultaneously hot-pressed at once.

What is claimed is:
1. A circuit board comprising:
  a first insulating layer having a single layer structure and having an upper surface;
  a first wiring layer embedded in the first insulating layer, the first wiring layer having an upper surface exposed from the upper surface of the first insulating layer such that the upper surface of the first wiring layer is substantially coplanar with the upper surface of the first insulating layer;

a semiconductor IC mounted on the upper surface of the first wiring layer with a die attach material interposed therebetween;

a second insulating layer stacked on the upper surface of the first wiring layer so as to embed the semiconductor IC;

a third wiring layer formed on a lower surface of the first insulating layer; and a third through-hole conductor penetrating the first insulating layer to electrically connect the first wiring layer to the third wiring layer, wherein a bottom surface of the die attach material is in contact with both of the upper surface of the first insulating layer and the upper surface of the first wiring layer.

2. The circuit board as claimed in claim 1, wherein the bottom surface of the die attach material is in contact with a plurality of signal wires constituting the first wiring layer.

3. The circuit board as claimed in claim 1, further comprising:

a second wiring layer formed on an upper surface of the second insulating layer;

a first through-hole conductor penetrating the second insulating layer to electrically connect the first wiring layer to the second wiring layer; and a second through-hole conductor penetrating the second insulating layer to electrically connect the second wiring layer to a terminal electrode of the semiconductor IC.

4. The circuit board as claimed in claim 1, further comprising:

a third insulating layer stacked on the upper surface of the second insulating layer so as to embed the second wiring layer;

a fourth wiring layer formed on an upper surface of the third insulating layer; and a fourth through-hole conductor penetrating the third insulating layer to electrically connect the second wiring layer to the fourth wiring layer.

5. The circuit board as claimed in claim 1, wherein the die attach material is a die attach film bonded on a bottom surface of the semiconductor IC.

6. The circuit board as claimed in claim 5, wherein the die attach film is thicker than a silicon part constituting the semiconductor IC.

7. The circuit board as claimed in claim 1, wherein the first insulating layer is free from a semiconductor IC.

8. The circuit board as claimed in claim 1, wherein the third wiring layer is formed on the lower surface of the first insulating layer such that the third wiring layer protrudes from the lower surface of the first insulating layer.

9. A method of manufacturing a circuit board, the method comprising:

a first step for preparing a stacked body of a base and a conductor foil and mounting a semiconductor IC on the conductor foil with a die attach material interposed therebetween;

a second step for forming a second insulating layer on the conductor foil so as to embed the semiconductor IC;

a third step for removing the base;

a fourth step for patterning the conductor foil to form a first wiring layer; and a fifth step for forming a first insulating layer on a lower surface of the second insulating layer so as to embed the first wiring layer, wherein in the fourth step, the conductor foil is patterned so that a portion of a bottom surface of the die attach material is covered with the first wiring layer and a remaining portion of the bottom surface of the die attach material is exposed, thereby the remaining portion of the bottom surface of the die attach material is in contact with the first insulating layer, and wherein the method further comprises a step for forming, after the second step, a first through hole that penetrates the second insulating layer to expose the conductor foil and a second through hole that penetrates the second insulating layer to expose a terminal electrode of the semiconductor IC.

10. The method of manufacturing a circuit board as claimed in claim 9, wherein the conductor foil includes a first conductor foil and a second conductor foil that are stacked in this order on a surface of the base, and wherein in the third step, the first conductor foil and the second conductor foil are peeled off at an interface therebetween, thereby using the second conductor foil as a material for the first wiring layer.

11. The method of manufacturing a circuit board as claimed in claim 10, wherein the second conductor foil is thicker than the first conductor foil.

12. A circuit board comprising:

a first insulating layer having a single layer structure and having an upper surface;

a second insulating layer having a lower surface;

a first wiring layer embedded in the first insulating layer, the first wiring layer having an upper surface exposed from the upper surface of the first insulating layer;

a second wiring layer formed on a lower surface of the first insulating layer;

a through-hole conductor penetrating the first insulating layer to electrically connect the first wiring layer to the second wiring layer;

a semiconductor IC embedded in the second insulating layer; and a die attach material provided between the first insulating layer and the semiconductor IC, the die attach material having a lower surface that is in contact with the upper surface of the first wiring layer, wherein the upper surface of the first insulating layer, the upper surface of the first wiring layer, the lower surface of the second insulating layer, and the lower surface of the die attach material are substantially coplanar with one another.

13. The circuit board as claimed in claim 12, wherein the first wiring layer includes a plurality of signal wires that are in contact with the lower surface of the die attach material.

14. The circuit board as claimed in claim 12, wherein the die attach material comprises a die attach film thicker than the semiconductor IC.

15. The circuit board as claimed in claim 12, wherein the first insulating layer is free from a semiconductor IC.

16. The circuit board as claimed in claim 12, wherein the second wiring layer is formed on the lower surface of the first insulating layer such that the second wiring layer protrudes from the lower surface of the first insulating layer.

* * * * *

UNITED STATES PATENT AND TRADEMARK OFFICE
CERTIFICATE OF CORRECTION

PATENT NO.           : 10,515,898 B2  
APPLICATION NO.      : 15/978443  
DATED                : December 24, 2019  
INVENTOR(S)          : Kazutoshi Tsuyutani and Masashi Katsumata It is certified that error appears in the above-identified patent and that said Letters Patent is hereby corrected as shown below:

On the Title Page

Insert, Item (30) To read:  
--Foreign Application Priority Data  
May 19, 2017[JP]        2017-099420--

Signed and Sealed this  
Twenty-sixth Day of October, 2021

Drew Hirshfeld  
*Performing the Functions and Duties of the*  
*Under Secretary of Commerce for Intellectual Property and*  
*Director of the United States Patent and Trademark Office*